(12) United States Patent
Chen et al.

(10) Patent No.: US 7,847,356 B2
(45) Date of Patent: Dec. 7, 2010

(54) METAL GATE HIGH-K DEVICES HAVING A LAYER COMPRISED OF AMORPHOUS SILICON

(75) Inventors: Tze-Chiang Chen, Yorktown Heights, NY (US); Bruce B. Doris, Slingerlands, NY (US); Vijay Narayanan, New York, NY (US); Vamsi Paruchuri, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/542,855

(22) Filed: Aug. 18, 2009

(65) Prior Publication Data
US 2009/0302396 A1    Dec. 10, 2009

Related U.S. Application Data

(62) Division of application No. 11/927,749, filed on Oct. 30, 2007.

(51) Int. Cl.
*H01L 27/088* (2006.01)
*H01L 27/092* (2006.01)
*H01L 29/78* (2006.01)

(52) U.S. Cl. .................. 257/369; 257/392; 257/410; 257/412; 257/E29.255; 257/E27.062

(58) Field of Classification Search .................. 257/369, 257/392, 410, 412
See application file for complete search history.

(56) References Cited

U.S. PATENT DOCUMENTS

| | | | |
|---|---|---|---|
| 7,105,889 B2 | 9/2006 | Bojarczuk, Jr. et al. | 257/354 |
| 2005/0087870 A1 | 4/2005 | Adetutu et al. | 257/751 |
| 2005/0136589 A1 | 6/2005 | Rotondaro et al. | 438/240 |
| 2006/0246647 A1 | 11/2006 | Visokay et al. | 438/199 |
| 2006/0246651 A1 | 11/2006 | Chambers et al. | 438/216 |
| 2007/0122962 A1 | 5/2007 | Chambers et al. | 438/199 |
| 2007/0152276 A1 | 7/2007 | Arnold et al. | 257/369 |
| 2009/0085175 A1 | 4/2009 | Clark et al. | 257/637 |

*Primary Examiner*—N Drew Richards
*Assistant Examiner*—Michael Jung
(74) *Attorney, Agent, or Firm*—Harrington & Smith (57) ABSTRACT

Disclosed is a method to fabricate a semiconductor device, and a device fabricated in accordance with the method. The method includes providing a substrate comprised of silicon; performing a shallow trench isolation process to delineate nFET and pFET active areas and, within each active area, forming a gate structure over a surface of the substrate, the gate structure comprising in order from the surface of the substrate, a layer of high dielectric constant oxide, a layer comprised of a metal, a layer comprised of amorphous silicon, and a layer comprised of polycrystalline silicon. The layer comprised of amorphous silicon is provided to substantially prevent regrowth of the high dielectric constant oxide layer in a vertical direction during at least a deposition and processing of the polycrystalline silicon layer and/or metal layer.

3 Claims, 13 Drawing Sheets

METAL GATE HIGH-K DEVICES HAVING A LAYER COMPRISED OF AMORPHOUS SILICON

This is a divisional patent application of copending U.S. patent application Ser. No. 11/927,749 filed Oct. 30, 2007.

TECHNICAL FIELD

The exemplary embodiments of this invention relate generally to semiconductor devices and methods to fabricate them and, more specifically, exemplary embodiments of this invention relate to a class of devices known as metal gate high-k dielectric constant (high-K or MHK) transistors.

BACKGROUND

During the fabrication of gate-first, MHK devices, patterning of the metal gate high k layers is required. However, the inventors have determined that the gate dielectric can grow significantly during a photoresist removal process. This is clearly undesirable, as the resulting thickness variations can result in the overall geometry and uniformity of the devices being significantly impaired. Additionally, the increased gate dielectric thickness degrades drain currents and also limits gate length scaling.

In US Patent Publication No.: 2005/0136589 A1 a method is shown to pattern high k layers which are present under gate electrode materials. The method consists of standard process steps to deposit a high k layer, next deposit a gate electrode material and then pattern the gate electrode followed by patterning or removal of the high k material from the extensions and source-drain regions out side the patterned gate electrode as a separate step in the patterning of the gate electrode. In this approach it is desired to prevent dielectric re-growth in the lateral direction. Since the high k material can absorb oxygen and move laterally, by eliminating the high k material outside of the gate electrode lateral dielectric re-growth nonuniformity can be reduced.

In US Patent Publication No.: 2006/0246647A1 a method is shown to form separate regions of $SiO_2$ and high k gate dielectrics on the same chip. The method uses a photoresist layer to block regions of high k dielectrics from being removed during a patterning process.

In US Patent Publication No.: 2006/0246651 there is shown a method to remove $SiO_2$ dielectric from an I/O region using a disposable barrier layer to protect the $SiO_2$ from damage during removal. The method is said to also eliminate contamination of the high k material to other components of the chip structure.

In US Patent Publication No.: 20070122962 there is shown a method to pattern high k dielectric regions and $SiO_2$ dielectric regions on a chip structure. The method utilizes a barrier layer to provide protection to the dielectric regions. The barrier layer is a disposable material which is directly in contact with the dielectric.

SUMMARY

The foregoing and other problems are overcome, and other advantages are realized, in accordance with the exemplary embodiments of this invention.

In a first aspect thereof the exemplary embodiments of this invention provide a method to fabricate a semiconductor device. The method includes providing a substrate comprised of silicon; performing a shallow trench isolation process to delineate nFET and pFET active areas and, within each active area, forming a gate structure over a surface of the substrate, the gate structure comprising in order from the surface of the substrate, a layer of high dielectric constant oxide, a layer comprised of a metal, a layer comprised of amorphous silicon, and a layer comprised of polycrystalline silicon. Generally, there is a patterning step between deposition of the layer comprised of amorphous silicon and deposition of the layer comprised of polycrystalline.

In a second aspect thereof the exemplary embodiments of this invention provide a transistor formed upon a substrate, where the transistor is comprised of a source region, a drain region and a gate structure disposed between the source region and the drain region. The gate structure comprises in order from a surface of the substrate, an interfacial layer comprised of $SiO2$ or $SiON$, a layer of high dielectric constant oxide, a layer comprised of a metal, a layer comprised of amorphous silicon, and a layer comprised of polycrystalline silicon. Generally, there is a patterning step between deposition of the layer comprised of amorphous silicon and deposition of the layer comprised of polycrystalline.

In these exemplary embodiments the layer comprised of amorphous silicon is provided to substantially prevent re-growth of the high dielectric constant oxide layer in a vertical direction during at least a deposition and processing of a second gate dielectric and/or metal layers.

BRIEF DESCRIPTION OF THE DRAWINGS

The foregoing and other aspects of the embodiments of this invention are made more evident in the following Detailed Description, when read in conjunction with the attached Drawing Figures, wherein.

DETAILED DESCRIPTION

An aspect of the exemplary embodiments of this invention utilizes a thin barrier layer to pattern a portion of a high-k dielectric and metal. This technique beneficially prevents re-growth in the vertical direction, and thus enables providing circuits with thin equivalent oxide thickness.

Another aspect of the exemplary embodiments of this invention provides a method and structure to pattern regions of high-K dielectric material using a capping layer which prevents damage and re-growth during high-k patterning and photoresist removal.

Another aspect of the exemplary embodiments of this invention provides a permanent barrier layer, that remains in the final structure.

Another aspect of the exemplary embodiments of this invention provides a barrier layer that does not come in contact with the dielectric material. Further, and in addition to the barrier layer being a permanent structure, the method reduces process steps for dual gate oxide/dual gate electrode process flows as compared to, for example, the method of the above-referenced US Patent Publication No.: 2007/0122962.

As will be described in detail below, the use of the exemplary embodiments of this invention solves the problem of unwanted dielectric growth during metal gate high-k patterning by the use of an oxygen diffusion barrier. In a presently preferred, although non-limiting embodiment, the oxygen diffusion barrier is a layer comprised of amorphous silicon (a-Si).

Figure 1A:
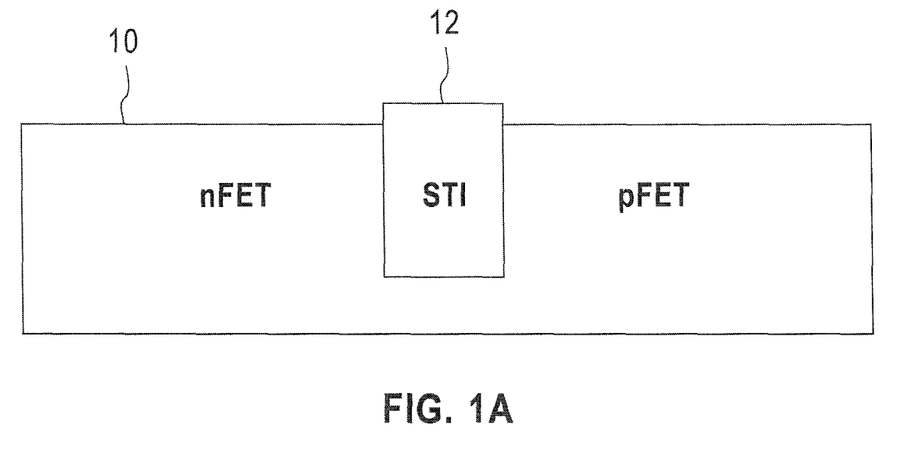
FIGS. 1A-1P are each an enlarged cross-sectional view of a portion of a semiconductor substrate and related structures, and show various process steps in accordance with the exemplary embodiments of this invention.
Figure 1B:
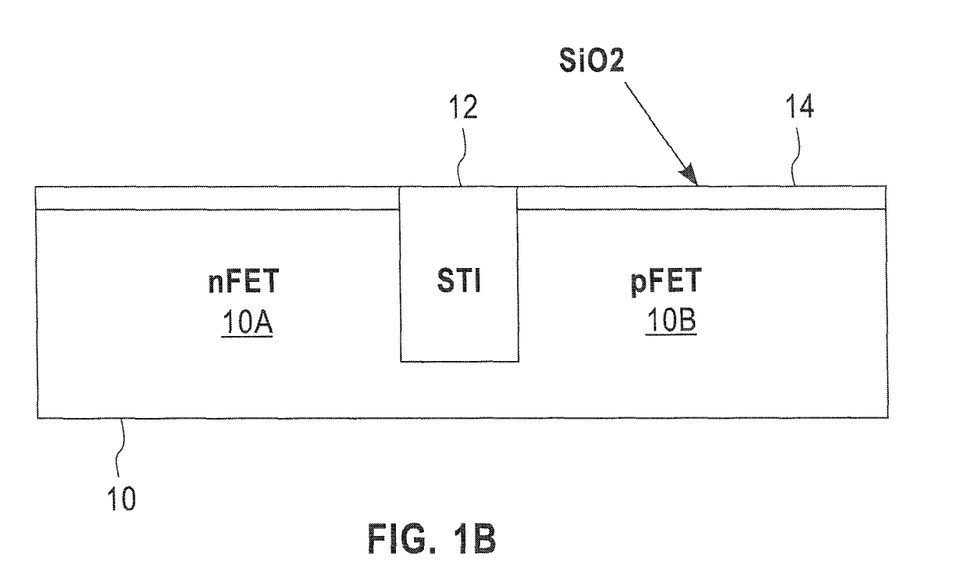
Figure 1C:
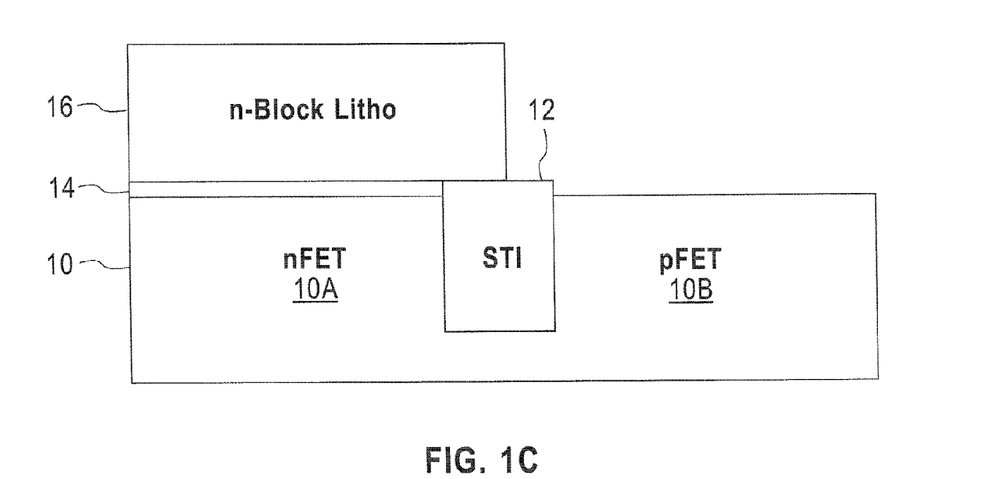
Figure 1D:
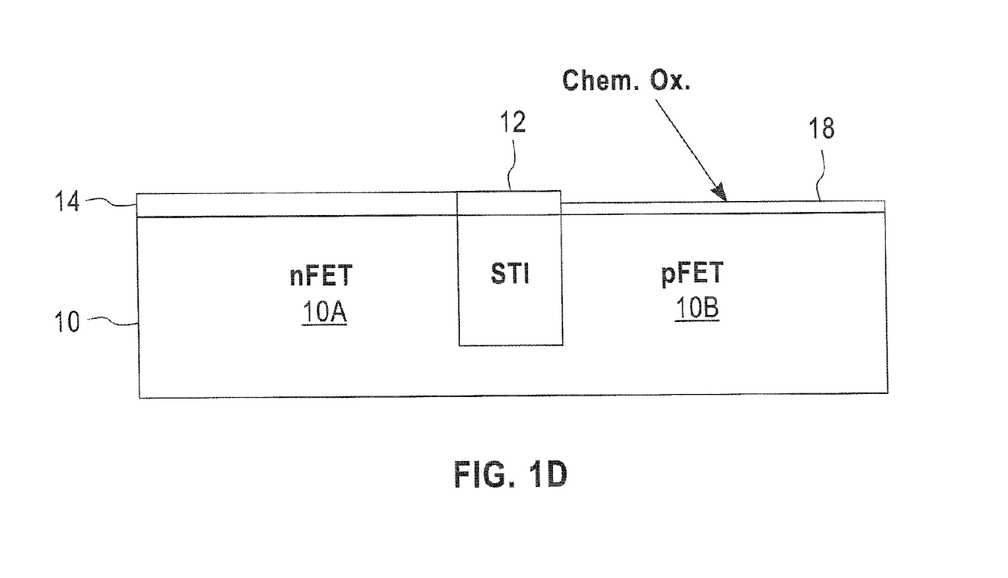
Figure 1E:
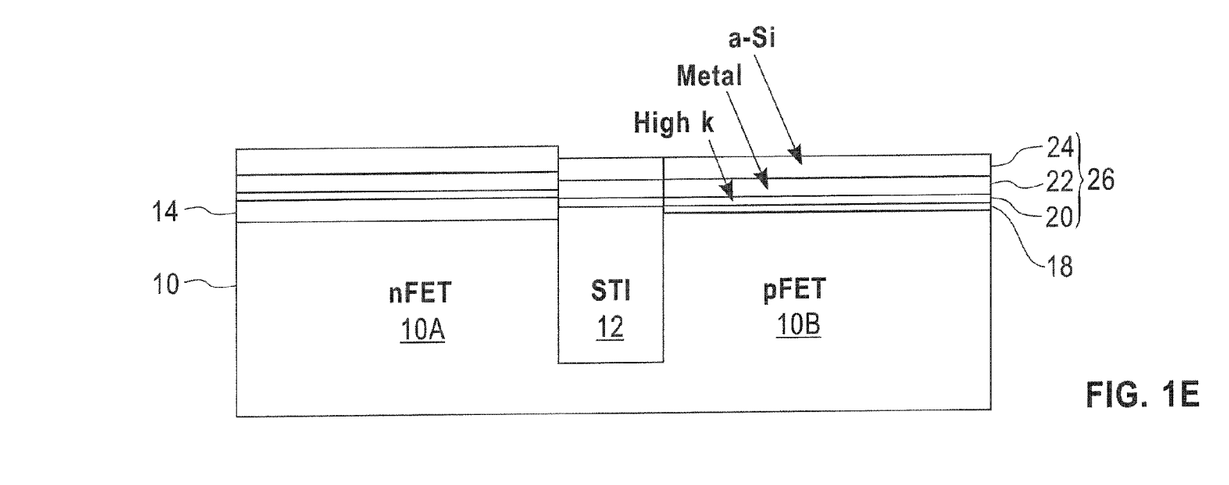
Figure 1F:
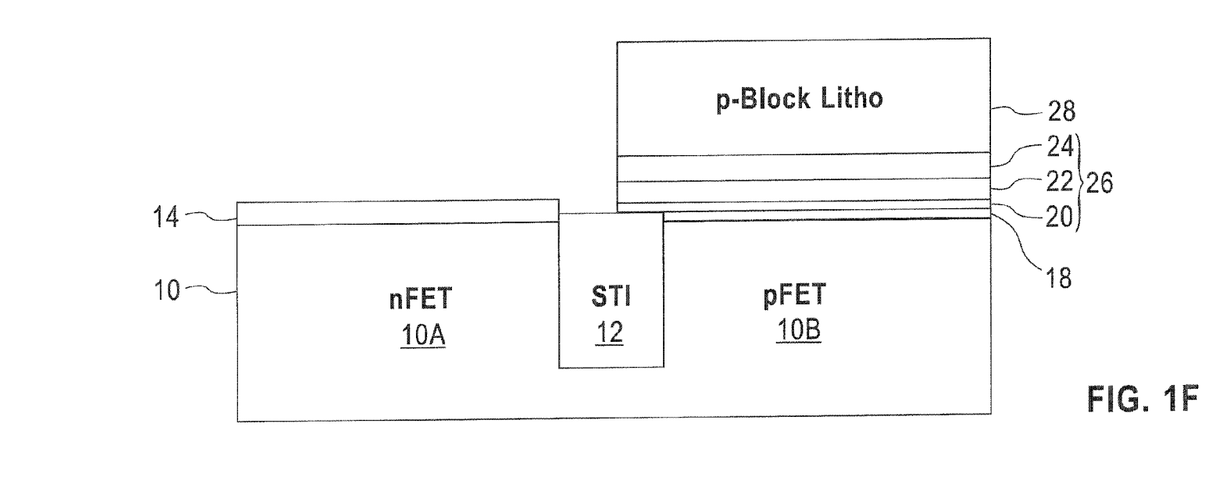
Figure 1G:
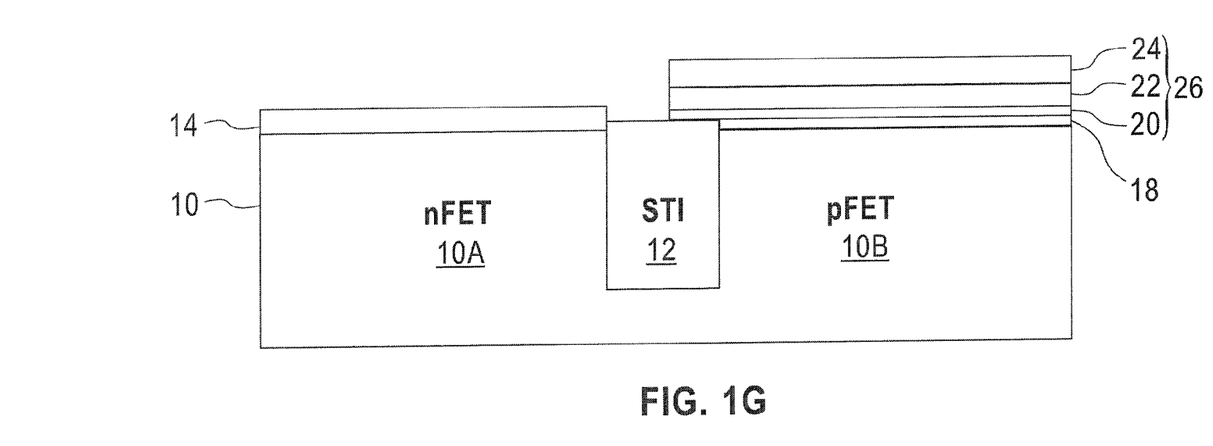
Figure 1H:
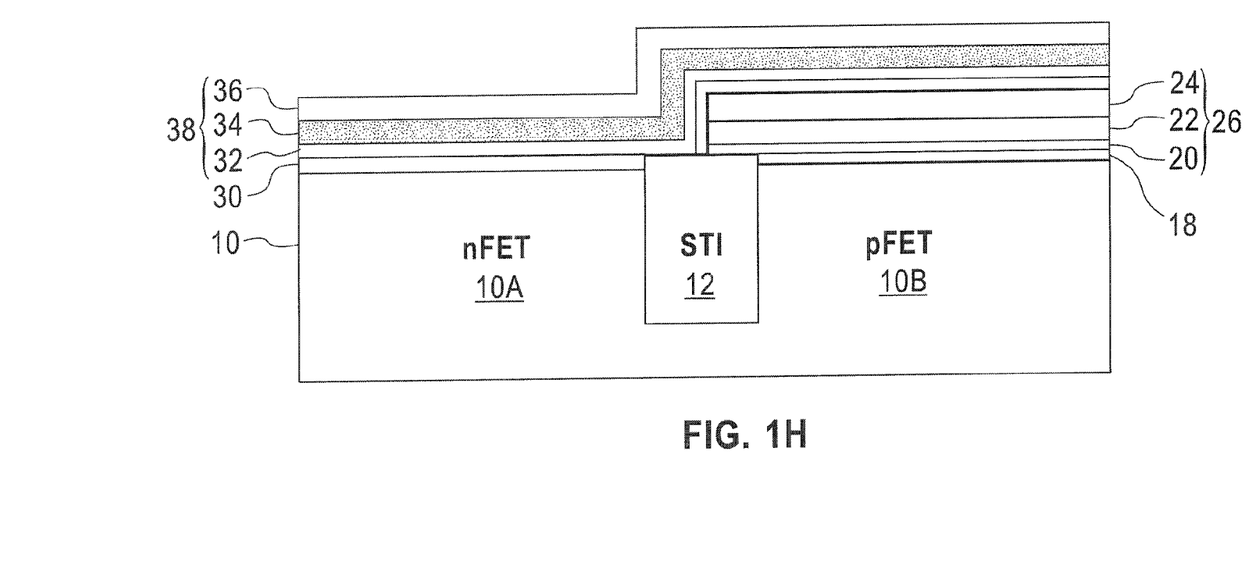
Figure 1I:
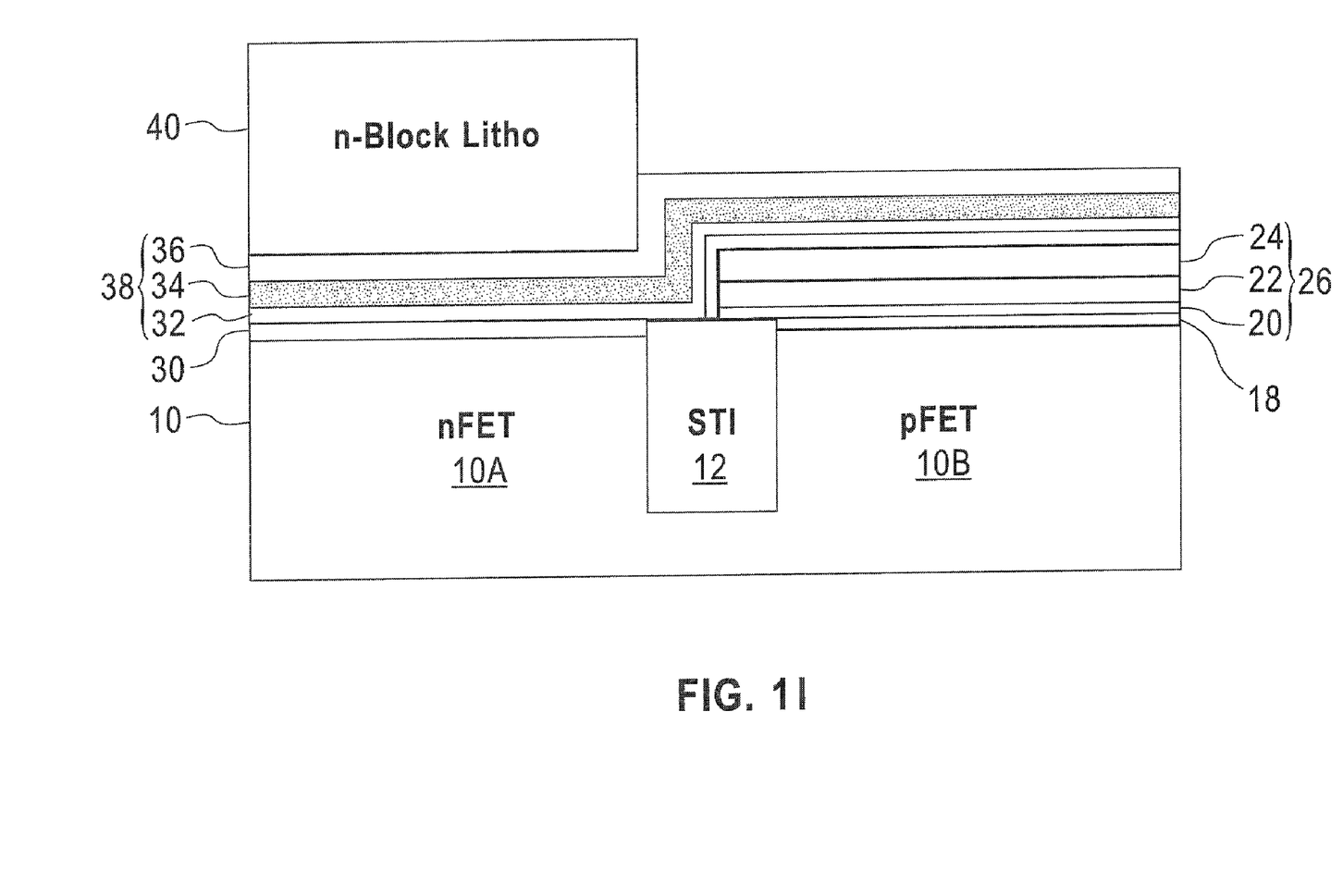
Figure 1J:
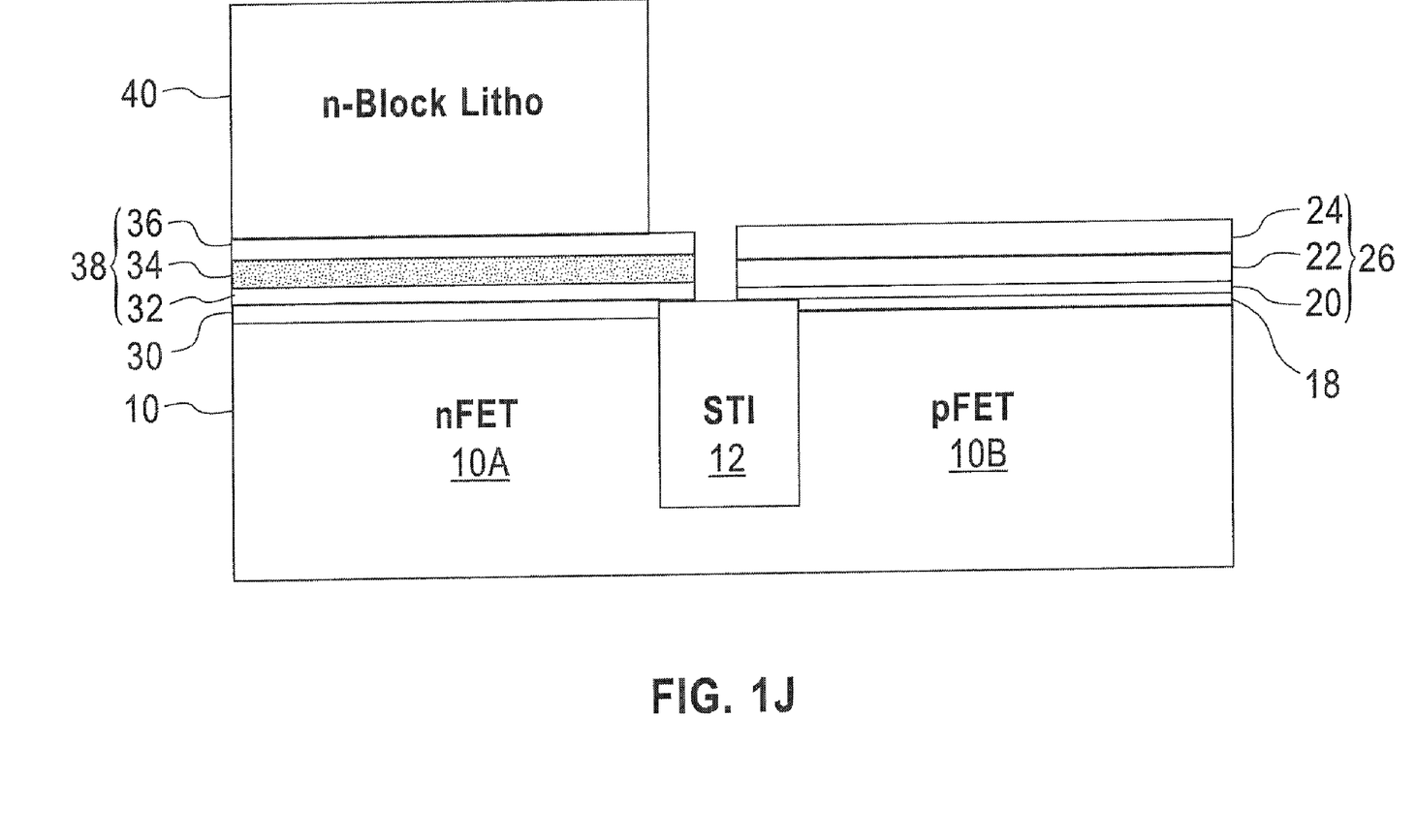
Figure 1K:
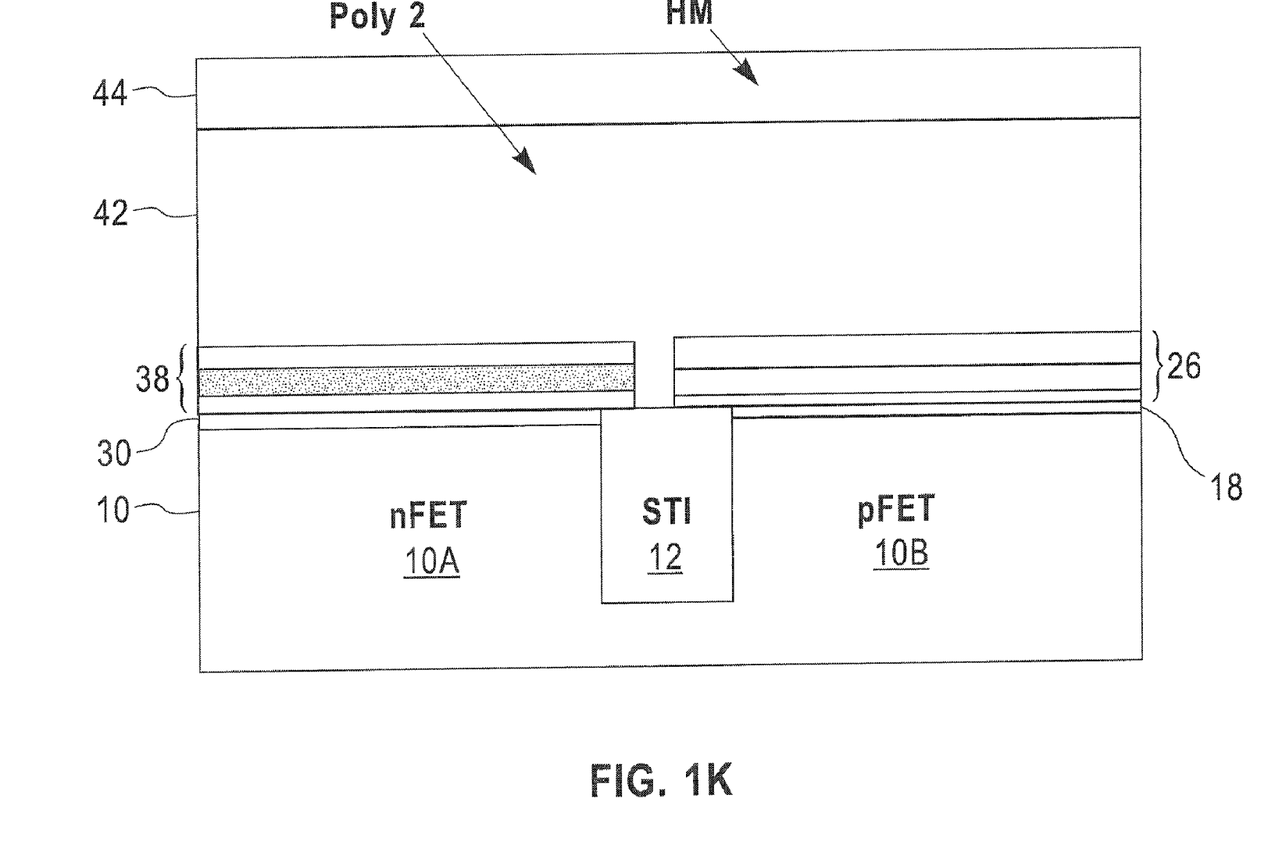
Figure 1L:
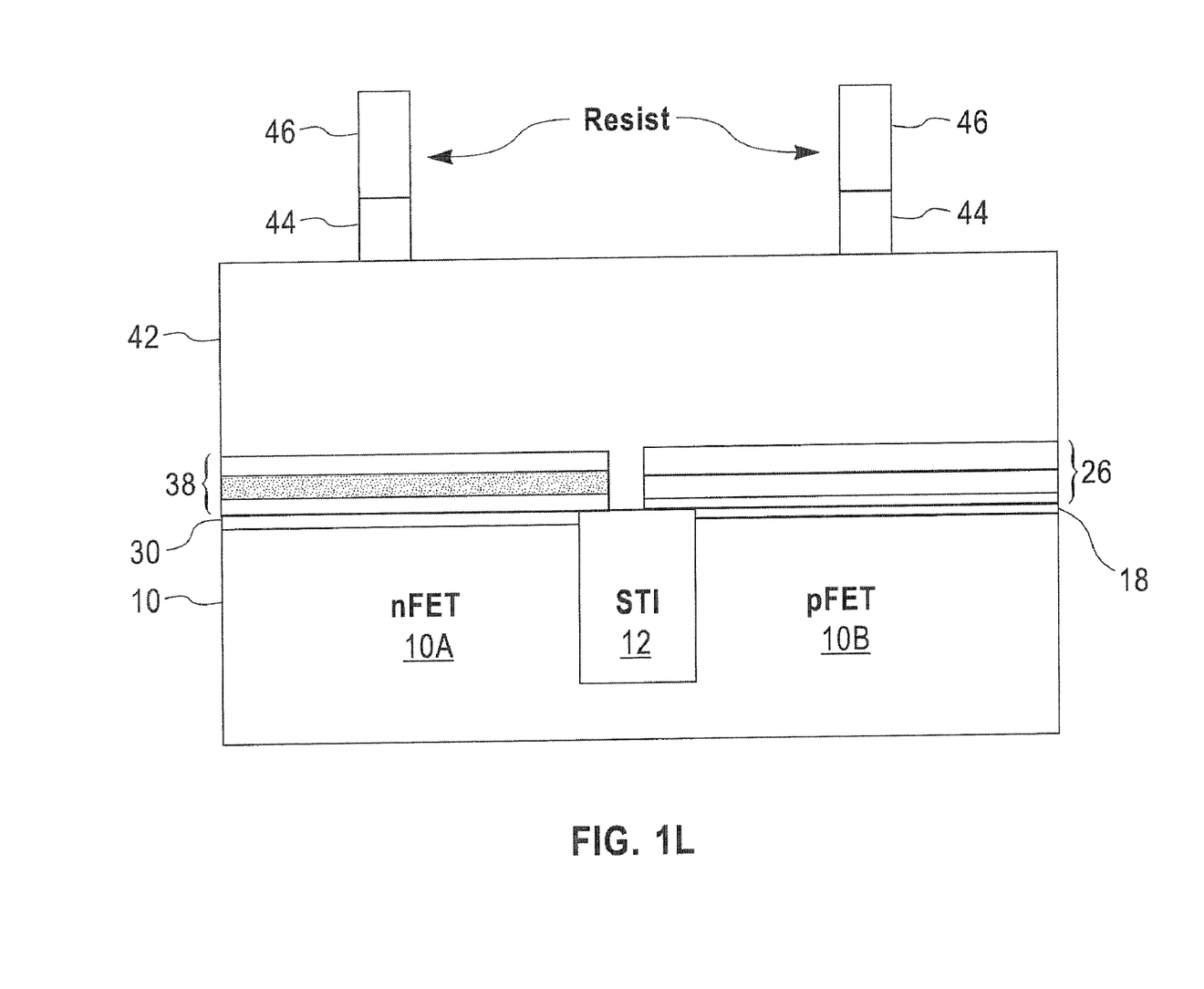
Figure 1M:
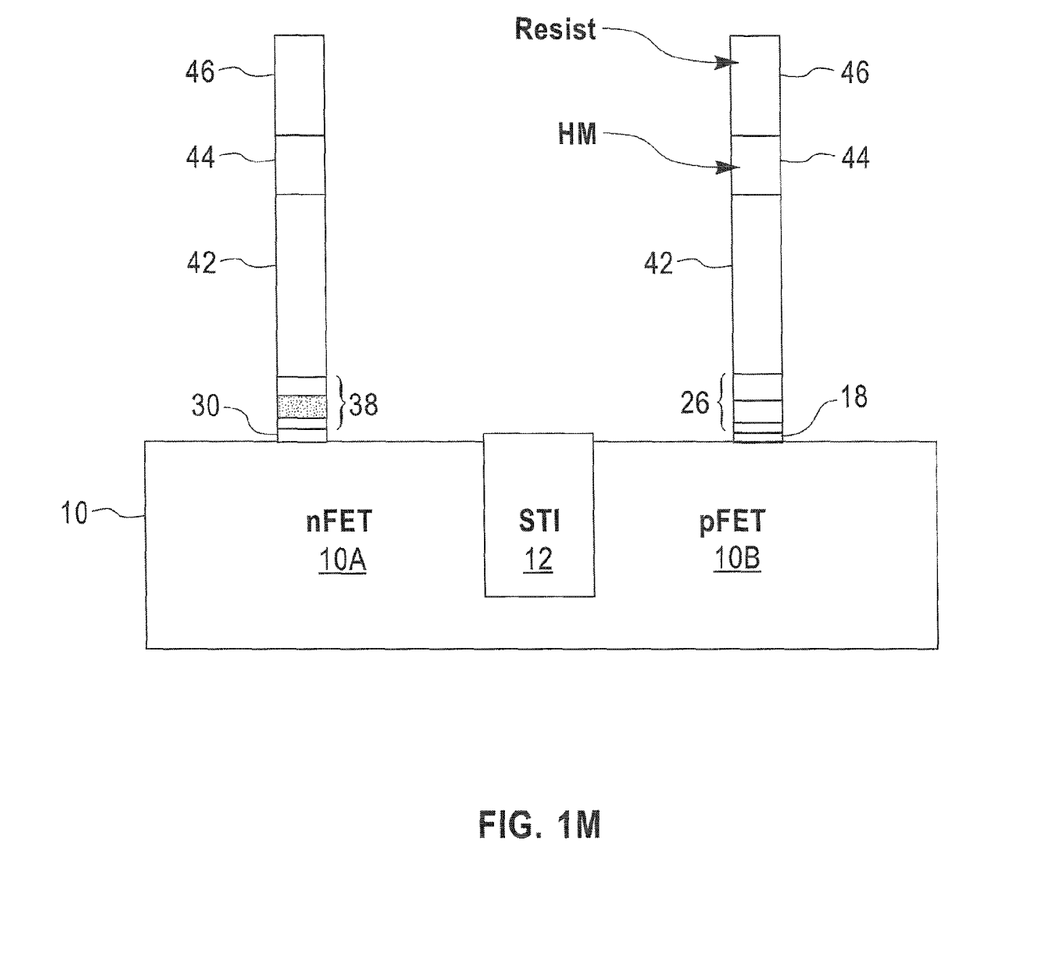
Figure 1N:
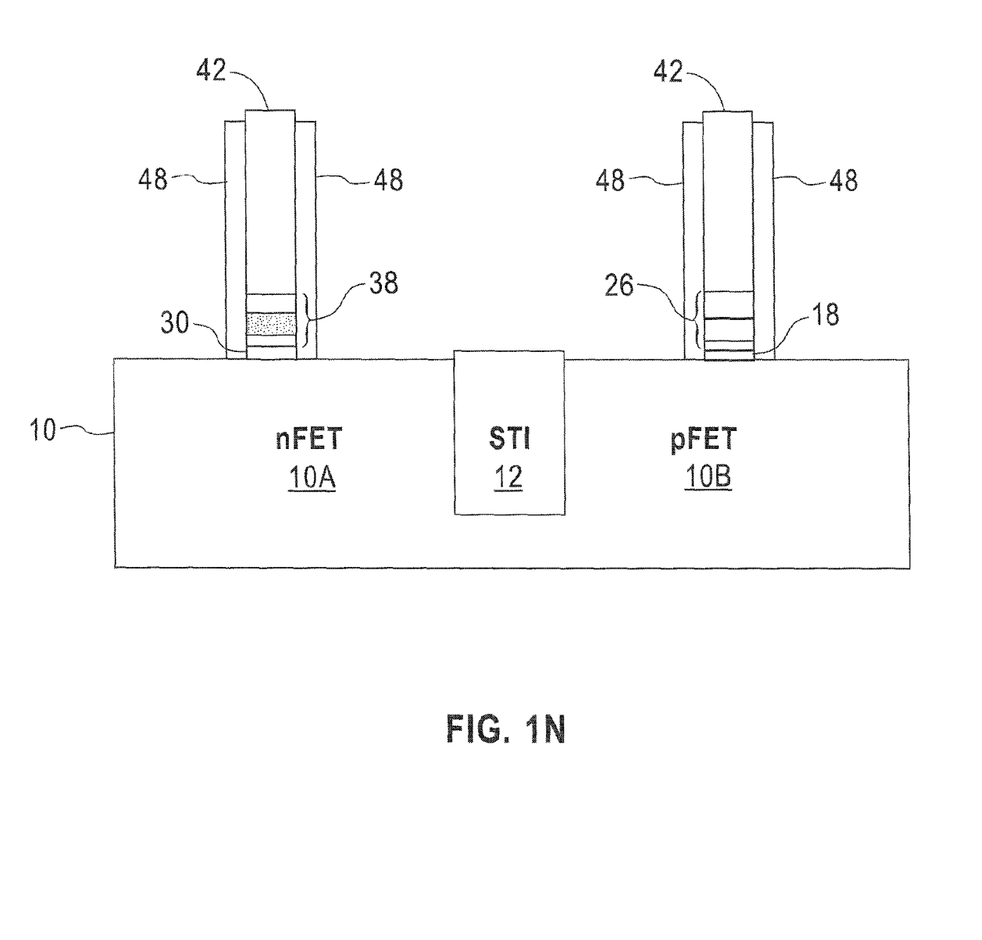
Figure 1P:
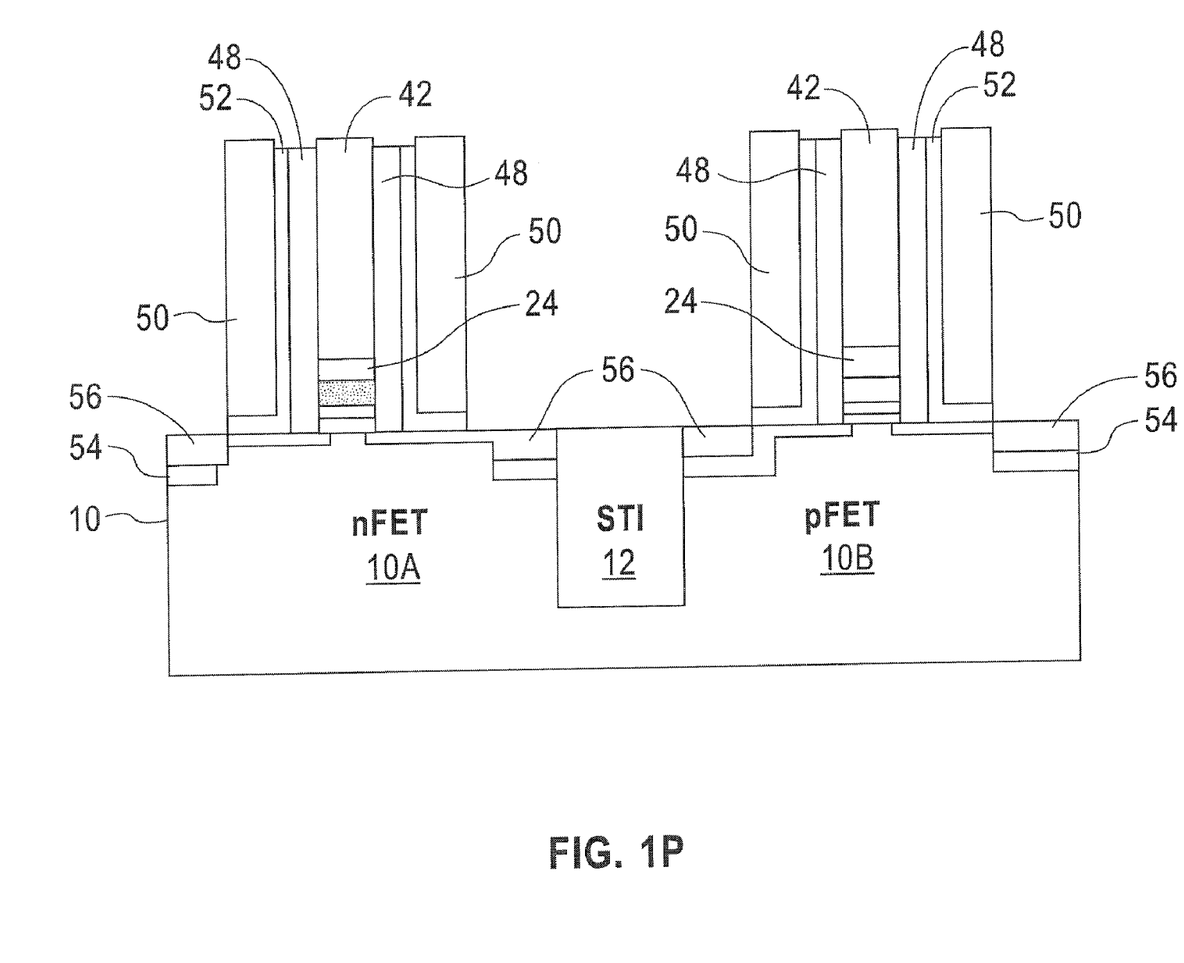

Reference is now made to FIGS. 1A-1P for showing various process steps in accordance with the exemplary embodiments of this invention. It is noted that FIGS. 1A-1P and their description below are presented as one non-limiting example for implementing exemplary embodiments of the invention. Furthermore, any specific measurements or ranges should similarly be considered as non-limiting examples.

In FIG. 1A a substrate 10 is shown having defined nFET and pFET regions 10A, 10B, and a shallow trench isolation (STI) region 12 formed therein by conventional processing. The starting substrate 10 may be a silicon-on-insulator (SOI) wafer or a bulk Si wafer. The SOI wafer may be a thick SOI wafer with SOI thickness in the 30-90 nm range, or it may be a thin SOI wafer with SOI thickness in the 5-30 nm range. For the case of a thick SOI starting wafer, SOI thinning may be performed to reduce the SOI thickness down to the 5-30 nm range using, as an example, an oxidation and hydrofluoric acid (HF) wet etch, as is well known. In other words, the initial choice of wafer type is not a limitation upon the practice of this invention.

FIG. 1B shows a thin (e.g., 6 nm) layer 14 of SiO2 that is grown over the substrate 10. The $SiO_2$ layer 14 is a sacrificial oxide layer.

FIG. 1C shows a layer of PR 16 (n-Block Litho) that is applied using a photolithography process over the nFET region 10A and partially over the STI 12. A pre-gate oxide cleaning step is then performed to remove the portion of the $SiO_2$ layer 14 over the pFET region 10B.

FIG. 1D shows the substrate 10 with the PR 16 removed and a thin layer of chemical oxide 18 grown over the pFET region 10B of the substrate 10.

FIG. 1E shows a blanket deposition of a layer 20 of the desired high-K material (oxide), a layer 22 of the desired pFET gate metal and, in accordance with the exemplary embodiments of this invention, a layer 24 of a-Si, thereby forming a pFET high-K/metal-gate stack 26 that includes the layer of a-Si 24. As can be seen, in the pFET region 10B the layers 20, 22 and 24 are applied over the layer of chemical oxide 18, while in the nFET region 10A the layers 20, 22 and 24 are applied over the sacrificial $SiO_2$ layer 14. Non-limiting examples of a high-k oxide 20 are $HfO_2$, $ZrO_2$, and $Ti_2O_5$, and non-limiting examples of the associated metal gate 22 are TiN and TaN. Optional capping layers, as are known in the art of creating high-k metal gate stacks, (not shown in the figures) may be used to provide work-function adjustment.

FIG. 1F shows a layer of PR 16 (p-Block Litho) that is applied over the pFET region 10B and partially over the STI 12. The layers 20, 22, 24 of high-K oxide, pFET metal and a-Si are then removed from the nFET region 10A.

FIG. 1G shows the PR 16 (p-Block Litho) removed.

FIG. 1H shows a thin layer of chemical oxide 30 grown over the nFET region 10A of the substrate 10, and a blanket deposition of a layer 32 of the desired high-K material (oxide), a layer 34 of the desired nFET gate metal and, in accordance with the exemplary embodiments of this invention, a layer 36 of a-Si, thereby forming an nFET high-K/metal-gate stack 38 that includes the layer of a-Si 36. As can be seen, in the nFET region 10A the layers 32, 34 and 36 are applied over the layer of chemical oxide 30. Non-limiting examples of a high-k oxide 32 are $HfO_2$, $ZrO_2$, and $Ti_2O_5$, and non-limiting examples of the associated metal gate 34 are TiN and TaN. Optional capping layers, as are known in the art of creating high-k metal gate stacks, (not shown in the figures) may be used to provide work-function adjustment.

FIG. 1I shows a layer of PR 40 (n-Block Litho) that is applied over the nFET region 10A.

FIG. 1J shows the structure after the nFET high-K/metal-gate stack 38 material layers 32, 34 and 36 are removed from the pFET region 10B. A suitable removal process is a reactive ion etch (RIE). The overlying portion of the chemical oxide layer 30 is also removed by the RIE process.

It can be noted that at this time both the nFET high-K/metal-gate stack 38 and the pFET high-K/metal-gate stack 26 include the a-Si material layer 36 and 24, respectively, to provide protection to the underlying nFET high-K oxide 32 and pFET high-K oxide 20, respectively. This protection will result in inhibiting vertical re-growth of the high-K oxide layers 32 and 20 during subsequent processing.

FIG. 1K shows the structure after removal of the PR 40 (n-Block Litho) and the deposition of a gate polysilicon (poly) layer 42 and an overlying $SiO_2$ hard mask (HM) 44.

FIG. 1L shows the result of patterning with PR 46 and the subsequent removal of the hard mask 44 in those regions where there is no overlying PR 46. This process begins the definition of the nFET 10A and pFET 10B gate structures.

FIG. 1M shows the further result of the definition of the nFET 10A and pFET 10B gate structures, where the non-protected poly Si 42 and the underlying layers of nFET and pFET a-Si, metal, high-K oxide and chemical oxide have all been stripped away.

FIG. 1N illustrates the structure after removal of the PR 46 and the hard mask 44, the formation of offset spacers 48, and extension and halo implantation into the substrate 10.

FIG. 1O shows a result of the formation of source and drain (S/D) spacers 50 after blanket deposition of a liner 52 and the performance of S/D implants 54. The liner 52 may be a thin nitride liner (e.g., 2-5 nm thickness) deposited to cap the gate stack. The nitride liner 52 functions as a diffusion barrier to oxygen and prevents the formation of an undesirable underlayer of $SiO_2$ beneath the high-K oxide layer 20. nFET S/D deep S/D ion implantation involves n-type species such as As, P, or Sb, while pFET deep S/D ion implantation involves p-type species such as B, BF2, or In.

FIG. 1P depicts the structure after the formation of silicide regions 56 and a forming gas anneal. Suitable metals may include, but are not limited to, Ni, Co, and Pt for forming silicide regions 56. The structure thus includes functional nFETs and pFETs, each of which includes the a-Si layer 24 in the high-K/metal gate stack structures 38 and 26, respectively.

It is noted that after the s/d anneal the a-Si will re-crystallize (i.e., the a-Si turns into poly-crystal). However, there will be a thin interfacial layer in-between the a-Si layer and the polycrystalline Si layer. There will likely be interfacial oxygen and/or carbon at the boundary between the a-Si layer and the polycrystalline Si layer.

Non-limiting examples of a-Si include SiC (i.e., silicon with some concentration of carbon) and SiGe (i.e., silicon with some concentration of germanium).

The a-Si layer may be doped or undoped (intrinsic). For example, the a-Si layer may be insitu doped or doped by ion implantation. If the polycrystalline Si layer is doped, the dopant may diffuse into the a-Si layer from ion implantation and/or junction anneal of the gate stack structure, as non-limiting examples.

Figure 2:
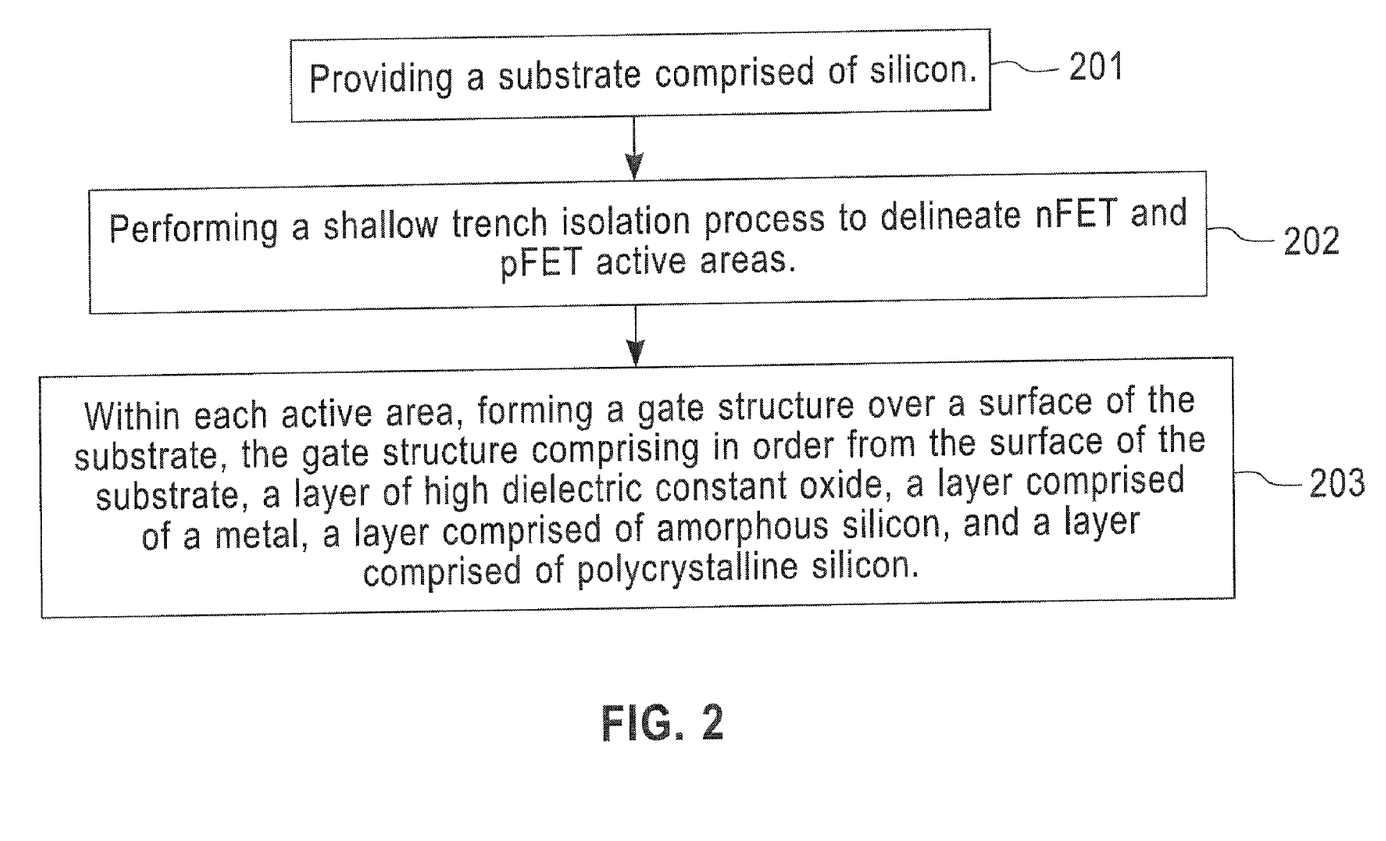
FIG. 2 depicts a flowchart illustrating one non-limiting example of a method for practicing the exemplary embodiments of this invention.

In one non-limiting, exemplary embodiment, and as shown in FIG. 2, a method comprises: providing a substrate comprised of silicon (box 201); performing a shallow trench isolation process to delineate nFET and pFET active areas (box 202); and within each active area, forming a gate structure over a surface of the substrate, the gate structure comprising in order from the surface of the substrate, a layer of high dielectric constant oxide, a layer comprised of a metal, a layer comprised of amorphous silicon, and a layer comprised of polycrystalline silicon (box 203).

A method as above, where the high dielectric constant oxide layer is comprised of at least one of $HfO_2$, $ZrO_2$ and $Ti_2O_5$, and where the layer comprised of a metal is comprised of at least one of TiN and TaN. A method as in any above, where the layer comprised of amorphous silicon has a thickness sufficient to substantially prevent regrowth of the high dielectric constant oxide layer in a vertical direction during at least a deposition and processing of at least one of said layer comprised of polycrystalline silicon and said layer comprised of a metal. A method as in any above, where the gate structure further comprises a capping layer configured to provide work function adjustment. A method as in any above, further comprising: patterning between deposition of the layer comprised of amorphous silicon and deposition of the layer comprised of polycrystalline.

In another non-limiting, exemplary embodiment, a transistor formed upon a substrate and comprising: a source region; a drain region; and a gate structure disposed between the source region and the drain region, said gate structure comprising in order from a surface of the substrate, a layer of high dielectric constant oxide, a layer comprised of a metal, a layer comprised of amorphous silicon, and a layer comprised of polycrystalline silicon.

A transistor as above, where the high dielectric constant oxide layer is comprised of at least one of $HfO_2$, $ZrO_2$ and $Ti_2O_5$, and where the layer comprised of a metal is comprised of at least one of TiN and TaN. A transistor as in any above, where the layer comprised of amorphous silicon has a thickness sufficient to substantially prevent regrowth of the high dielectric constant oxide layer in a vertical direction during at least a deposition and processing of at least one of said layer comprised of polycrystalline silicon and said layer comprised of a metal. A transistor as in any above, where the gate structure further comprises a capping layer configured to provide work function adjustment.

In a further non-limiting, exemplary embodiment, an electronics component comprising: a substrate comprised of silicon; a first gate structure disposed over a nFET active area of the substrate; and a second gate structure disposed over a pFET active area of the substrate, wherein the first gate structure and the second gate structure each comprise, in order from a surface of the substrate, a layer of high dielectric constant oxide, a layer comprised of a metal, a layer comprised of amorphous silicon, and a layer comprised of polycrystalline silicon.

An electronics component as above, where the layer of high dielectric constant oxide is comprised of at least one of $HfO_2$, $ZrO_2$ and $Ti_2O_5$, and where the layer comprised of a metal is comprised of at least one of TiN and TaN. An electronics component as in any above, where the layer comprised of amorphous silicon has a thickness sufficient to substantially prevent regrowth of the layer of high dielectric constant oxide in a vertical direction during at least a deposition and processing of at least one of said layer comprised of polycrystalline silicon and said layer comprised of a metal. An electronics component as in any above, where the gate structure further comprises a capping layer configured to provide work function adjustment. An electronics component as in any above, where the layer comprised of amorphous silicon comprises at least one of SiGe and SiC.

In another non-limiting, exemplary embodiment, a circuit comprising an electronics component, said electronics component comprising: a substrate comprised of silicon; a first gate structure disposed over a nFET active area of the substrate; and a second gate structure disposed over a pFET active area of the substrate, wherein the first gate structure and the second gate structure each comprise, in order from a surface of the substrate, a layer of high dielectric constant oxide, a layer comprised of a metal, a layer comprised of amorphous silicon, and a layer comprised of polycrystalline silicon.

A circuit as above, where the layer of high dielectric constant oxide is comprised of at least one of $HfO_2$, $ZrO_2$ and $Ti_2O_5$, and where the layer comprised of a metal is comprised of at least one of TiN and TaN. A circuit as in any above, where the layer comprised of amorphous silicon has a thickness sufficient to substantially prevent regrowth of the layer of high dielectric constant oxide in a vertical direction during at least a deposition and processing of at least one of said layer comprised of polycrystalline silicon and said layer comprised of a metal. A circuit as in any above, where the gate structure further comprises a capping layer configured to provide work function adjustment. A circuit as in any above, where the layer comprised of amorphous silicon comprises at least one of SiGe and SiC.

Various modifications and adaptations may become apparent to those skilled in the relevant arts in view of the foregoing description, when read in conjunction with the accompanying drawings and the appended claims. As but some examples, the use of other similar or equivalent materials and/or processing equipment may be attempted by those skilled in the art. However, all such and similar modifications of the teachings of this invention will still fall within the scope of this invention.

Further, the various disclosed layer thicknesses and ranges of thicknesses, processing temperatures, cleaning and etching compositions and the like are intended to be read in an exemplary sense, and not as imposing limitations on the practice of the exemplary embodiments of this invention.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. An electronics component comprising:
   a substrate comprised of silicon;
   a first gate structure disposed over a nFET active area of the substrate; and
   a second gate structure disposed over a pFET active area of the substrate, wherein the first gate structure and the second gate structure each comprises, in order from a surface of the substrate, a layer of high dielectric constant oxide, a layer comprised of a metal, a layer comprised of amorphous silicon, and a layer comprised of polycrystalline silicon, where the layer comprised of amorphous silicon comprises at least one of SiGe and SiC.

2. The electronics component of claim 1, where the layer of high dielectric constant oxide is comprised of at least one of $HfO_2$, $ZrO_2$ and $Ti_2O_5$, and where the layer comprised of a metal is comprised of at least one of TiN and TaN.

3. The electronics component of claim 1, where the gate structure further comprises a capping layer configured to provide work function adjustment.

* * * * *